(12) United States Patent  
Rahman

(10) Patent No.: US 7,998,853 B1  
(45) Date of Patent: Aug. 16, 2011

(54) SEMICONDUCTOR DEVICE WITH THROUGH SUBSTRATE VIAS

(75) Inventor: Arifur Rahman, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 96 days.

(21) Appl. No.: 12/419,276

(22) Filed: Apr. 6, 2009

(51) Int. Cl.
*H01L 21/4743* (2006.01)

(52) U.S. Cl. ... 438/618; 438/106; 438/14; 257/E21.499; 257/E21.506; 257/E21.511; 257/E21.521

(58) Field of Classification Search .......... 438/14, 438/106, 618, 598, 637, 700; 257/E21.52, 257/499, 57, 506, 511
See application file for complete search history.

(56) References Cited

U.S. PATENT DOCUMENTS

| | | | | |
|---|---|---|---|---|
| 7,759,212 | B2 * | 7/2010 | Lin et al. | 438/384 |
| 7,790,503 | B2 * | 9/2010 | Lin et al. | 438/107 |
| 2009/0283871 | A1 * | 11/2009 | Chang et al. | 257/621 |
| 2010/0127394 | A1 * | 5/2010 | Ramiah et al. | 257/751 |

OTHER PUBLICATIONS

Hsu, Howard, MEMS Solution for Semiconductor Probing, South-Western Testing Workshop Presentation, SCS Hightech, Inc., Jun. 6, 2005, 25 pp., available http://www.swtest.org/swtw_library/2005proc/PDF/S04_01_Hsu.pdf.
Mori, Ryuichiro, 3D-MEMS Probe for Fine Pitch Probing , R& D, Japan Electronic Materials Corp., IEEE SW Test Workshop, Jun. 3-6, 2007, 27 pp., available http://www.swtest.org/swtw_libray/2007proc/PDF/S05_03_Mori_SWTW2007.pdf.

* cited by examiner

*Primary Examiner* — David Nhu

(74) *Attorney, Agent, or Firm* — Robert M. Brush; John J. King; Thomas George

(57) ABSTRACT

Methods for making and testing a semiconductor device with through substrate vias are described. In some examples, a method of making a semiconductor device includes: forming through substrate vias (TSVs) in a substrate having an integrated circuit (IC) die, the substrate including an active side and a backside, the active side having conductive interconnect formed thereon, the TSVs including exposed portions on the backside of the substrate; patterning first metal on the active side of the substrate to electrically couple the TSVs to a portion of the conductive interconnect; and coupling the exposed portions of the TSVs on the backside of the substrate to electrically couple together the plurality of TSVs.

15 Claims, 9 Drawing Sheets

SEMICONDUCTOR DEVICE WITH THROUGH SUBSTRATE VIAS

FIELD OF THE INVENTION

One or more aspects of the present invention relate generally to semiconductor devices and, more particularly, to a semiconductor device with through substrate vias.

BACKGROUND OF THE INVENTION

As semiconductor technology has advanced, the amount and speed of logic available on an IC, such as a field programmable gate array (FPGA), has increased more rapidly than the number and performance of I/O connections. As a result, IC die stacking techniques have received renewed interest to address the interconnection bottleneck of high-performance systems. In stacked IC applications, two or more ICs are stacked vertically and interconnections are made between them. Such a stacked arrangement is referred to as a system-in-package (SIP). Exemplary stacked arrangements include a mother IC and one or more daughter ICs stacked thereon, such as an FPGA mother IC with one or more memory daughter ICs.

Through substrate vias (TSVs) (also referred to as through die vias (TDVs)) can be employed to establish interconnections between mother and daughter ICs. A TSV is a metal via that extends through a substrate (die) of one IC for coupling to interconnect of another IC. In the conventional process flow for die stacking, TSVs are tested only after the daughter IC(s) is/are attached to a mother IC. The attachment of the daughter IC(s) creates a loopback path between TSVs, e.g., mother IC->TSV->daughter IC->TSV->mother IC. However, a low manufacturing yield for the TSVs cannot be detected before the attachment of the daughter IC(s) to the mother IC. As a result, in some cases, "good" daughter ICs can be attached to a "bad" mother IC with low-yielding TSVs. This will affect the overall yield of the stacked devices and increases costs.

Accordingly, there exists a need in the art for methods for making and testing a semiconductor device having TSVs prior to stacking.

SUMMARY OF THE INVENTION

One embodiment of the invention relates to a method of making a semiconductor device. The method includes: forming through substrate vias (TSVs) in a substrate having an integrated circuit (IC) die, the substrate including an active side and a backside, the active side having conductive interconnect formed thereon, the TSVs including exposed portions on the backside of the substrate; patterning first metal on the active side of the substrate to electrically couple the TSVs to a portion of the conductive interconnect; and coupling the exposed portions of the TSVs on the backside of the substrate to electrically couple together each of the TSVs.

In this embodiment, the TSVs can be formed in the IC die. The IC die can include programmable circuitry, and the portion of the conductive interconnect can electrically couple the TSVs to the programmable circuitry. In addition, the method can include configuring the programmable circuitry to electrically couple the TSVs to die pads on the active side of the substrate, and also probing the die pads to test the TSVs. The IC die is one of the IC dies on the substrate, and the TSVs can be formed in a scribe area between the IC die and another IC die of the multiple IC dies. The step of patterning the first metal can include forming test pads exposed on the active side of the substrate and electrically coupled to the TSVs. The method can further include probing the test pads to test the TSVs. The step of coupling can further include patterning second metal on the backside of the substrate to electrically couple together each of the TSVs. The step of coupling can include contacting the exposed portions of the TSVs with test probes on a test substrate to electrically couple together each of the TSVs.

Another embodiment of the invention relates to a method of testing a semiconductor device. The method includes: obtaining a substrate including an integrated circuit (IC) die, an active side, a backside, and first and second through substrate vias (TSVs), the active side having conductive interconnect formed thereon, the first and second TSVs including exposed portions on the backside of the substrate, where the substrate includes first metal on the active side to electrically couple the first and second TSVs to a portion of the conductive interconnect and second metal on the backside of the substrate to electrically couple together the first and second TSVs; and probing pads on the active side of the substrate to characterize a loopback path formed by the first and second TSVs.

In this embodiment, the first and second TSVs can be formed in the IC die. The IC die can include programmable circuitry, and the portion of the conductive interconnect can electrically couple the first and second TSVs to the programmable circuitry. The pads can include die pads coupled to the conductive interconnect; and the method further includes configuring the programmable circuitry to electrically couple the first and second TSVs to the die pads. The IC die can be one of the IC dies on the substrate, and the first and second TSVs are formed in a scribe area between the IC die and another IC die of the plurality of IC dies. The pads can include test pads electrically coupled to the first and second TSVs.

Yet another embodiment of the invention relates to a method of testing a semiconductor device. The method includes: obtaining a substrate including an integrated circuit (IC) die, an active side, a backside, and first and second through substrate vias (TSVs), the active side having conductive interconnect formed thereon, the first and second TSVs including exposed portions on the backside of the substrate, where the substrate includes metal on the active side to electrically couple the first and second TSVs to a portion of the conductive interconnect; contacting the exposed portions of the first and second TSVs with respective first and second test probes on a test substrate, the first and second test probes being electrically coupled; and probing pads on the active side of the substrate to characterize a loopback path formed by the first and second TSVs through the first and second test probes.

In this embodiment, the first and second TSVs can be formed in the IC die, and the portion of the conductive interconnect can electrically couple the first and second TSVs to the programmable circuitry. The pads can include die pads coupled to the conductive interconnect, and the method can further include configuring the programmable circuitry to electrically couple the first and second TSVs to the die pads. The IC die can be one of multiple IC dies on the substrate, and the first and second TSVs are formed in a scribe area between the IC die and another IC die of the multiple IC dies. The pads can include test pads electrically coupled to the first and second TSVs.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Methods for making and testing a semiconductor device with through substrate vias (TSVs) are described. In some embodiments, particular TSVs are formed in the semiconductor device for testing purposes ("test TSVs"). Other TSVs are formed in mother integrated circuit (IC) die on the semiconductor device for the purpose of communicating signals with stacked daughter IC die ("signal TSVs"). During fabrication, the test TSVs are electrically coupled to form loopback paths. Continuity of the loopback paths can be measured to characterize the TSV fabrication process, including the signal TSVs. This testing can be used to identify "good" and "bad" mother IC dies. In order to better describe the methods of making and testing a semiconductor device, first the structure of an exemplary semiconductor device already fabricated is described.

Figure 1:
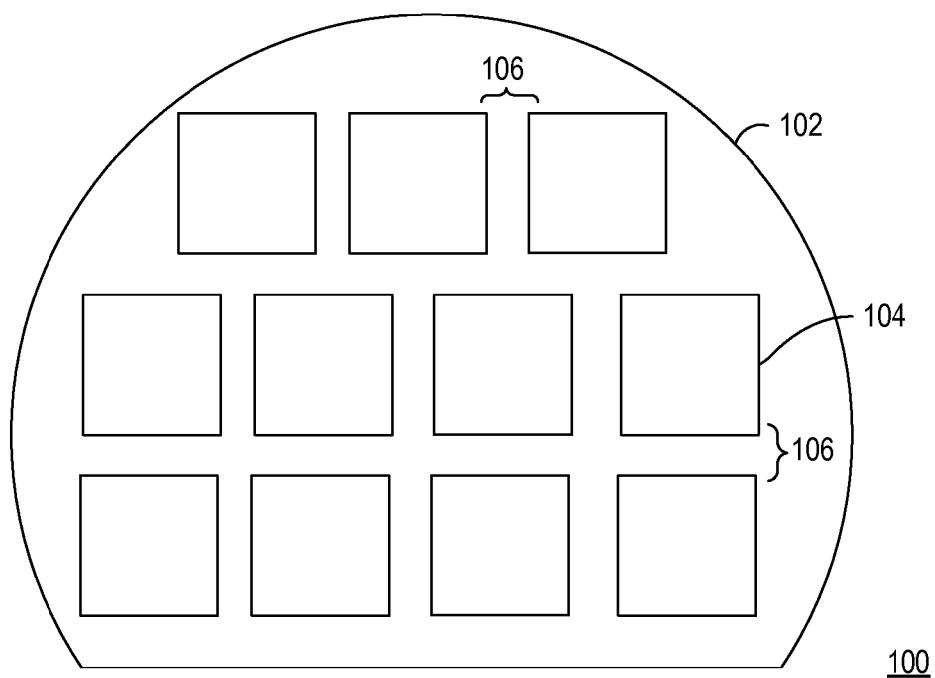
FIG. 1 is a top-view of a semiconductor device according to some embodiments of the invention.

FIG. 1 is a top-view of a semiconductor device 100 according to some embodiments of the invention. The semiconductor device 100 includes a semiconductor substrate ("substrate 102") having a plurality of integrated circuit (IC) devices 104. Each of the IC devices 104 includes a first IC die, referred to as a "mother IC die", and at least one additional IC die, referred to as "daughter IC die". The daughter IC die are stacked on the backside of the mother IC die for each IC device 104. FIG. 1 shows the active side of the mother IC die for each IC device 104 and thus the daughter IC die are hidden from view. The substrate 102 also includes a scribe area 106 that exists between the IC devices 104. The substrate 102 can be sawn within the scribe area 106 to separate the individual IC devices 104.

Figure 2:
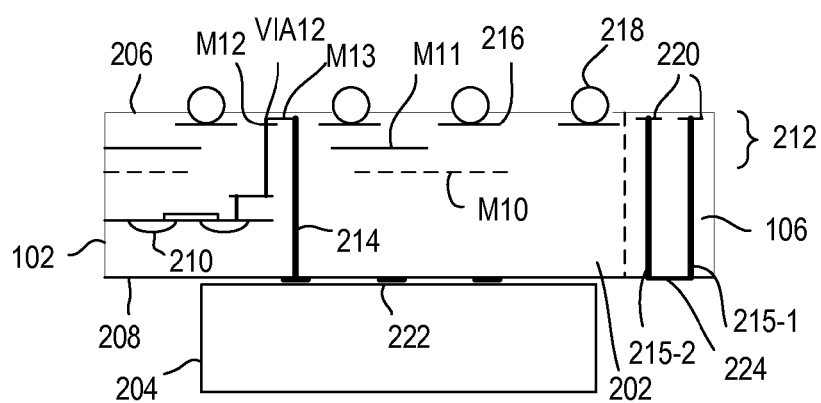
FIG. 2 is a cross-section view showing a portion of the semiconductor device of FIG. 1 according to some embodiments of the invention.

FIG. 2 is a cross-section view showing a portion 200 of the semiconductor device 100 according to some embodiments of the invention. The portion 200 shows a single IC device 104 having a mother IC die 202 and a daughter IC die 204. The substrate 102 includes an active side 206 and a backside 208. Active circuitry (symbolized by a transistor 210) and conductive interconnect 212 are formed on the active side of the substrate 102 thereby defining the mother IC die 202. The substrate 102 includes a plurality of through substrate vias (TSVs) extending between the active side 206 and the backside 208. By way of example, a through substrate via (TSV) 214 and TSVs 215-1 and 215-2 (collectively TSVs 215) are shown. In the present example, the TSV 214 is part of the mother IC die 202 and the TSVs 215 are formed in the scribe area 106 adjacent to the mother IC die 202.

By way of example, the conductive interconnect 212 includes 13 conductive layers, of which layers M10-M13 are explicitly shown. The substrate 102 may include more or less layers. The layer M12 is patterned to provide die pads 216 for the mother IC die 202. Solder balls 218 are coupled to the die pads 216. The layer M13 may be a redistribution layer that is patterned to electrically couple the TSV 214 to the layer M12 (e.g., through VIA12). The layer M13 may optionally be patterned to form test pads 220 coupled to the TSVs 215. The conductive interconnect 212 is generally coupled to the active circuitry of the mother IC die 202, e.g., the layer M12 is shown as being coupled to the transistor 210 such that there is an electrical path between the transistor 210 and the TSV 214. While only a single connection between the active circuitry and the conductive interconnect 212 is shown, in a practical application, there are a myriad of different connections.

The substrate 102 includes contacts 222 formed on the backside 208. The contacts 222 are configured to couple TSVs of the mother IC die 202 to the daughter IC die 204. For example, one of the contacts 222 is coupled to the TSV 214. The TSV 214 electrically couples the conductive interconnect 212 of the mother IC die 202 with conductive interconnect on the daughter die 204 (not shown). In this manner, the TSV 214 provides a mechanism for communicating signals between the mother IC die 202 and the daughter IC die 204.

In the embodiment shown, the substrate 102 includes a metal trace 224 that couples the TSV 215-1 to the TSV 215-2. The TSVs 215 can be used to characterize the TSV fabrication process during fabrication of the semiconductor device 100. Notably, the TSVs 215 can be used for testing before the daughter die 204 is attached to the backside 208 and before the active side 206 is bumped with the solder balls 218. As noted above, the TSVs 215 are coupled to the test pads 220 on the active side 206. The TSVs 215-1 and 215-2 form a loopback path through the metal trace 224. During testing, the test pads 220 can be probed to characterize the loopback path. This testing can provide an indication of whether the TSVs in the mother IC die 202 are "good" (e.g., the TSV 214). If the testing indicates that the TSVs in the mother IC die 202 are "bad", then the daughter IC die 204 can be omitted to avoid attached a good daughter IC die to a bad mother IC die.

The TSVs 215 used for testing purposes ("test TSVs") shown in FIG. 2 represent one embodiment of testing described herein. Embodiments of making and testing the semiconductor device 100 are described below. For example, in other embodiments, test TSVs can be formed in the mother IC die 202. When formed in the mother IC die 202, the test TSVs can be coupled to test pads formed on M13 similar to the test pads 220 formed in the scribe area 106. In some embodiments, the test TSVs can be coupled to the active circuitry of the mother IC die 202 through M13, similar to the TSV 214. In such embodiments, the active circuitry can be configured to couple the test TSVs to specific die pads 216.

Figure 3:
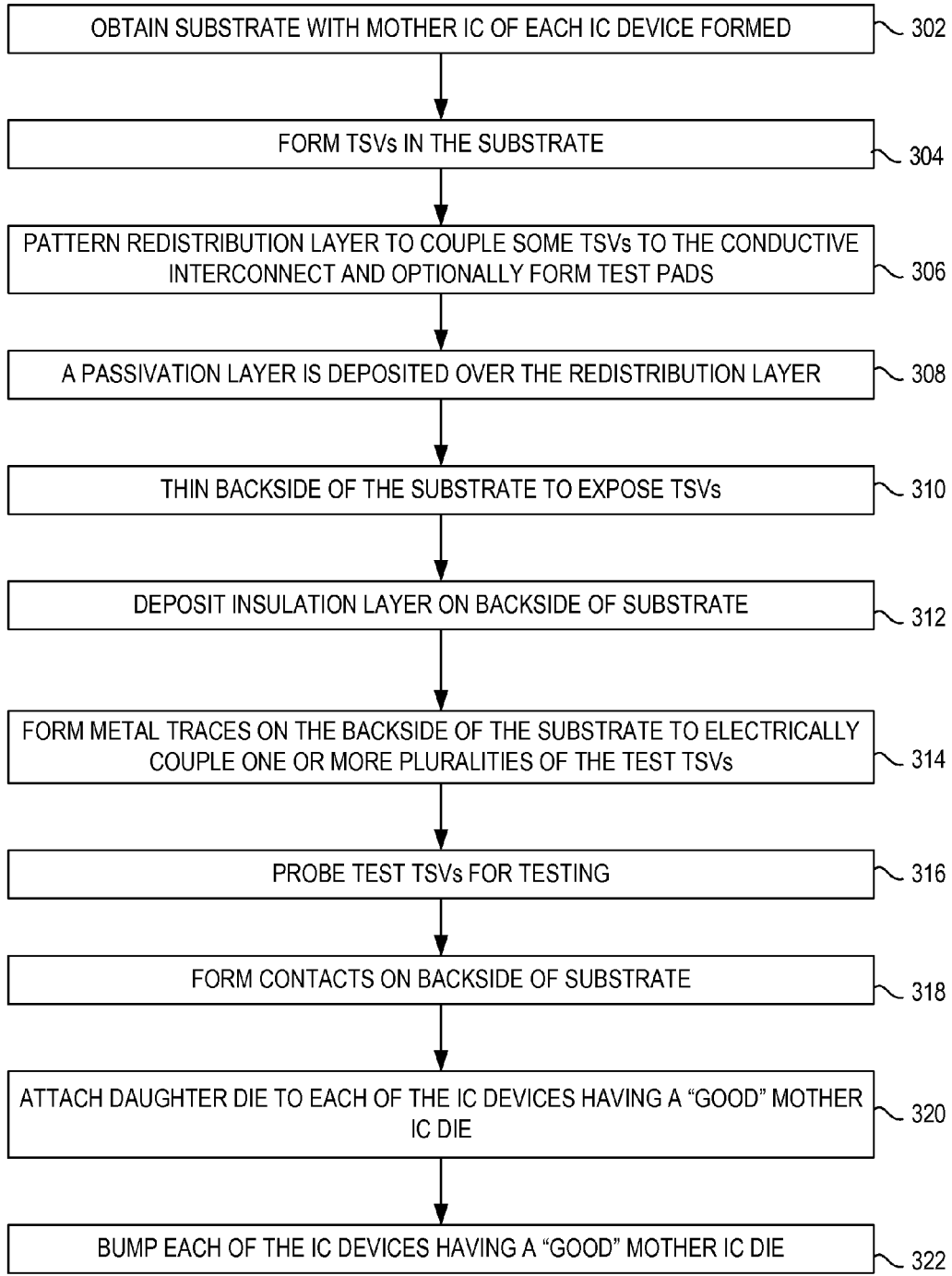
FIG. 3 is a flow diagram depicting a method of making a semiconductor device according to some embodiments of the invention.
Figure 4A:
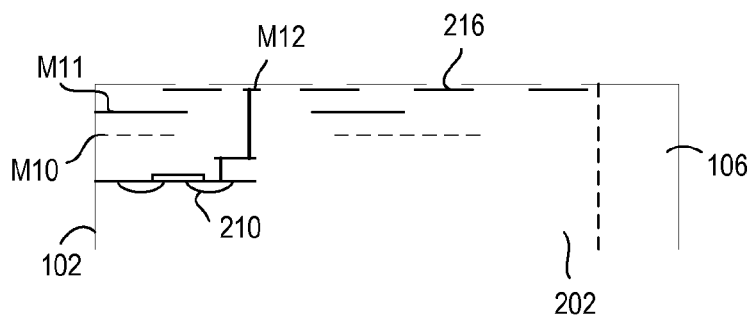
FIGS. 4A-H are cross-sections of a portion of a semiconductor device corresponding to steps in the method of FIG. 3.

FIG. 3 is a flow diagram depicting a method 300 of making a semiconductor device according to some embodiments of the invention. FIGS. 4A-H are cross-sections of a portion of the semiconductor device corresponding to steps in the method 300. Elements in FIGS. 4A-H that are the same or similar to those shown in FIGS. 1 and 2 are designated with identical reference numerals. The method 300 begins at step 302, where the substrate 102 is obtained with the mother IC die 202 of each IC device 104 formed. The substrate 102 includes active circuitry and base layers of the conductive interconnect 212 (e.g., layers M1-M12) of each IC device 104. This is shown in FIG. 4A.

Figure 4B:
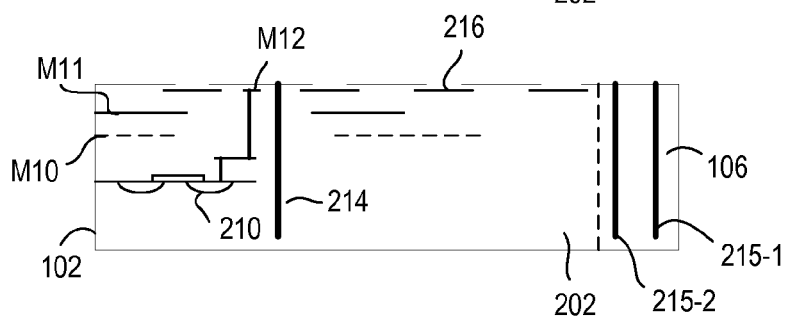

At step 304, TSVs are formed in the substrate 102. TSV formation is well known in the art. Generally, TSVs can be formed by etching holes in the substrate 102, insulating the sidewalls of the holes, depositing a barrier layer on the hole sidewalls, and electroplating a metal, such as copper, in the holes. The formed TSVs include both signal TSVs and test TSVs. Signal TSVs are formed in the mother IC die 202 of each IC device 104. In some embodiments, test TSVs are formed adjacent the mother IC die 202 of each IC device 104 in the scribe area 106. In some embodiments, test TSVs are formed in the mother IC die 202 of each IC device 104. As shown in FIG. 4B, TSVs 214 and 215 are formed and extend from the active side of the substrate 102 to a point near the backside. The TSV 214 is a signal TSV, and the TSVs 215 are test TSVs. By way of example, the TSVs 215 are formed in the scribe area 106.

Figure 4C:
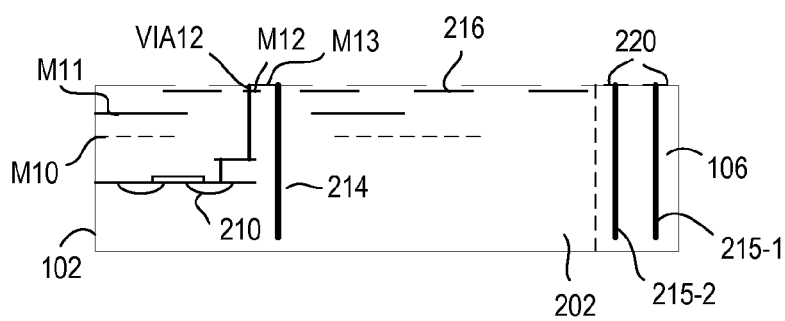

At step 306, a redistribution layer is patterned to couple some of the TSVs to the conductive interconnect 212 and, optionally, form test pads for some of the TSVs. For example, a redistribution layer can couple signal TSVs to a lower layer, which is in turn coupled to active circuitry. This is shown in FIG. 4C, where layer M13 and VIA12 couple the TSV 214 to the layer M12, which is in turn coupled to the transistor 210 of the active circuitry. The redistribution layer can optionally form test pads for test TSVs. This is shown in FIG. 4C, where layer M13 includes the test pads 220 coupled to the TSVs 215. In some embodiments, test TSVs can be formed in the mother IC die 202 similar to the TSV 214. In such embodiments, the redistribution layer can optionally form test pads for the test TSVs similar to the test pads in the scribe area 106. Alternatively, the redistribution layer can couple test TSVs formed in the mother IC die 202 to a lower layer of the conductive interconnect 212, which is in turn coupled to active circuitry. To characterize the test TSVs, the active circuitry of the mother IC die 202 can be powered and configured to couple the test TSVs to specific ones of the die pads 216, as described further below.

Figure 4D:
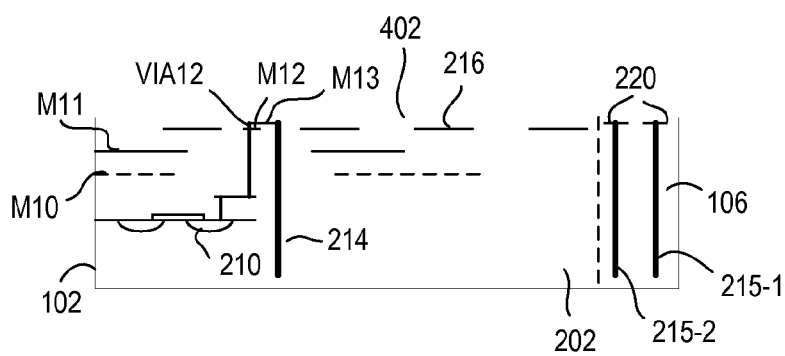

At step 308, a passivation layer is deposited over the redistribution layer. A passivation layer 402 is shown in FIG. 4D. The passivation layer 402 insulates the redistribution layer M13. Openings in the passivation layer 402 are formed to expose the die pads 216, as well as the test pads 220 (if present).

Figure 4E:
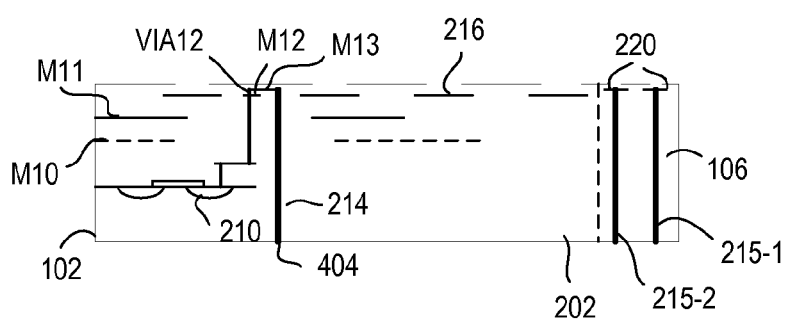

At step 310, the backside of the substrate is thinned to expose the TSVs. Exposed portions 404 of the TSVs 214 and 215 at the backside of the substrate 102 are shown in FIG. 4E.

Figure 4F:
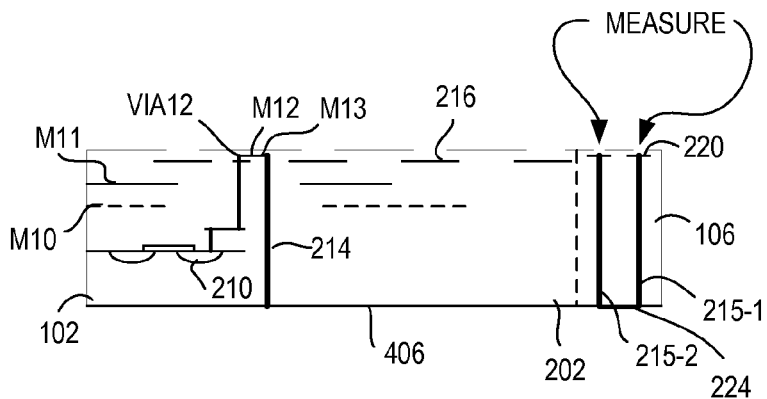

At step 312, an insulation layer is deposited over the backside of the substrate. At step 314, metal traces are formed on the backside of the substrate to electrically couple one or more pluralities of test TSVs. For example, as shown in FIG. 4F, an insulation layer 406 is deposited on the backside of the substrate 102. The TSV 215-1 is electrically coupled to the TSV 215-2 by the metal trace 224. The metal trace 224 is coupled to the exposed portions of the TSVs 215 on the backside of the substrate 102 through the insulation layer 406. The TSVs 215-1 and 215-2 form a loopback path through the metal trace 224. By way of example, two test TSVs are shown coupled to form the loopback path. It is to be understood that more than two test TSVs may be provided. Further, more than two test TSVs may be coupled together by metal on the backside of the substrate 102.

Figure 5:
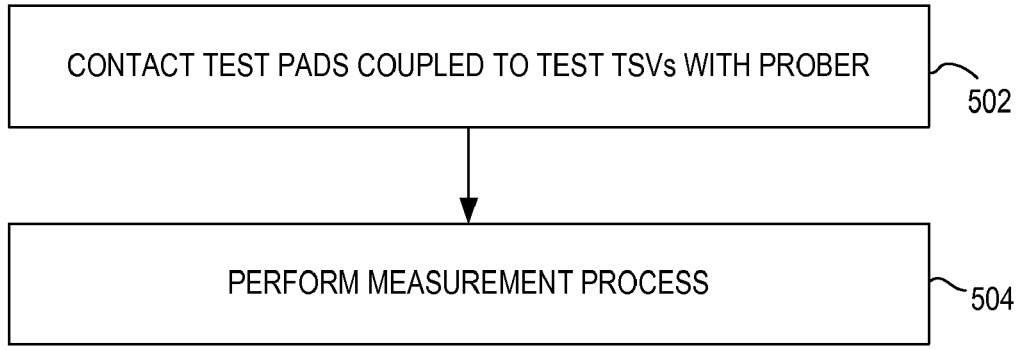
FIG. 5 is a flow diagram depicting a method of probing test TSVs according to some embodiments of the invention.
Figure 6:
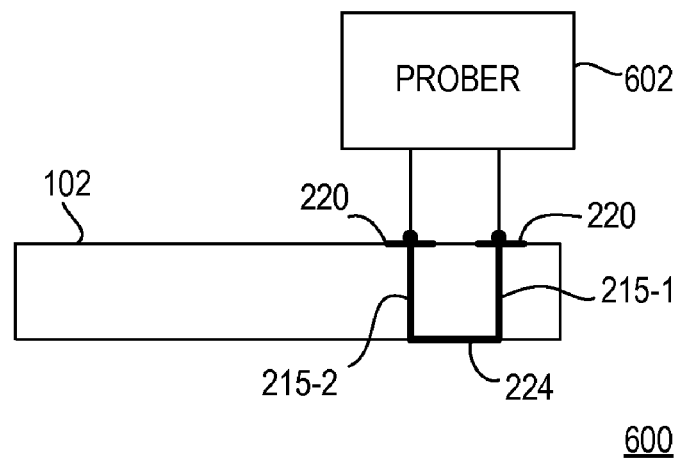
FIG. 6 is a block diagram depicting a test system according to some embodiments of the invention.

At step 316, the test TSVs can be probed for testing. The testing process depends on the configuration of the test TSVs. As noted above, in some embodiments, the test TSVs may be coupled to special test pads (e.g., the test pads 220). An exemplary method for testing test TSVs coupled to test pads is shown in FIGS. 5 and 6. In other embodiments, the test TSVs may be formed in the mother IC die such that they are selectively coupled to specific die pads. An exemplary method for testing test TSVs using specific die pads is shown in FIGS. 7 and 8.

In the embodiment above, the TSVs are formed in step 304 after formation of the substrate 102 is formed (i.e., after the base layers M1-M12 of the conductive interconnect 212 is formed). This is generally referred to as a "via last" process. In other embodiments, a "via first" process may be employed. For example, the TSVs may be formed during fabrication of the substrate 102, e.g., after formation of M1 or after formation of M1 and M2. The TSVs can then be coupled to the conductive interconnect and active circuitry by patterning M1 and/or M2 of the conductive interconnect 212, rather than using the redistribution layer as in step 306. The rest of the fabrication process may be completed as described above.

FIG. 5 is a flow diagram depicting a method 500 of probing test TSVs according to some embodiments of the invention. FIG. 6 is a block diagram depicting a test system 600 according to some embodiments of the invention. Referring to FIGS. 5 and 6, at step 502, a prober 602 contacts test pads coupled to test TSVs (e.g., the test pads 220 coupled to the TSVs 215). A prober is a well known device configured to test semiconductor devices during manufacture. At step 504, the prober 602 performs a measurement process. The prober 602 can test continuity of loopback path(s) formed by the test TSVs in order to characterize the TSV fabrication process. In the present example, the TSV 215-1 and the TSV 215-2 are coupled by the metal trace 224 to form a loopback path tested by the prober 602. The results of the measurement can be used as an indication of whether the TSV fabrication process has yielded "good" or "bad" TSVs in the mother IC die. The test process described in FIGS. 5 and 6 can be performed for each IC device 104 on the substrate 102 either in parallel, sequentially, or a combination thereof (e.g., sequentially testing groups of devices, where the devices are tested in parallel in each group).

Figure 7:
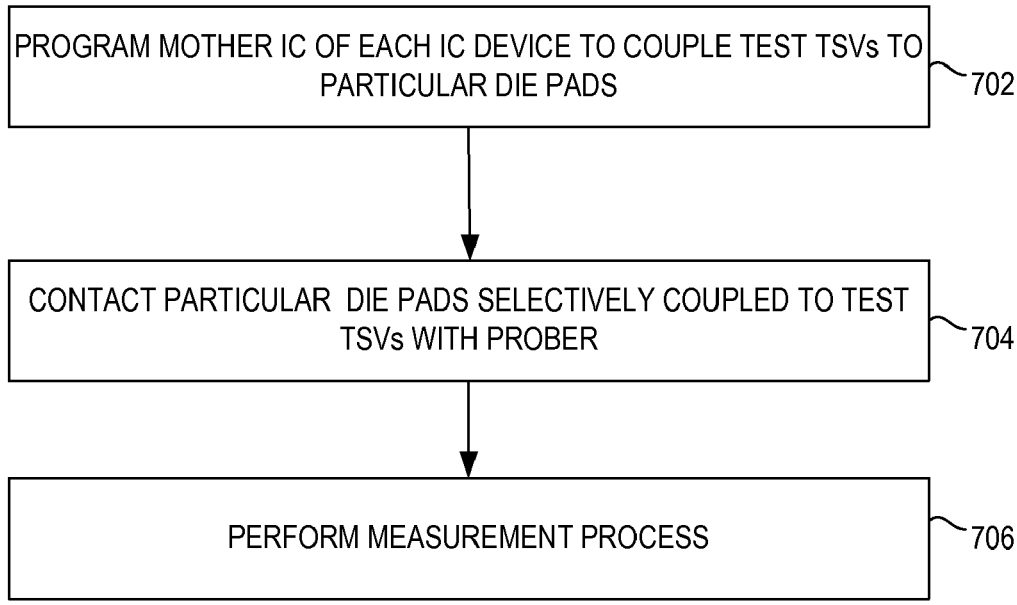
FIG. 7 is a flow diagram depicting another method of probing test TSVs according to some embodiments of the invention.
Figure 8:
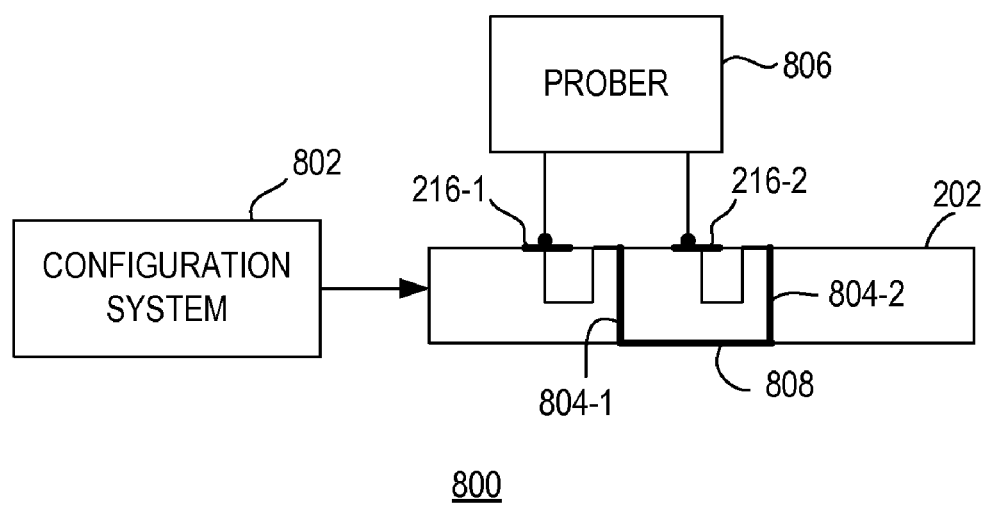
FIG. 8 is a block diagram depicting a test system according to some embodiments of the invention.

FIG. 7 is a flow diagram depicting another method 700 of probing test TSVs according to some embodiments of the invention. FIG. 8 is a block diagram depicting a test system 800 according to some embodiments of the invention. Referring to FIGS. 7 and 8, at step 702, a configuration system 802 programs the mother IC die 202 to couple test TSVs to particular die pads. For example, the mother IC die 202 may be a programmable device, such as a field programmable gate array (FPGA). An exemplary FPGA is described below with respect to FIG. 11. The configuration system 802 can apply power to the mother IC die 202 and then program the mother IC die 202 with a predefined test program. The test program is configured to selectively couple test TSVs to particular die pads. For example, test TSVs 804-1 and 804-2 formed in the mother IC die 202 can be selectively coupled to die pads 216-1 and 216-2 of the die pads 216. The die pads 216 are part of the external interface of the mother IC die 202, as opposed to being special purpose test pads.

At step 704, a prober 806 contacts the specific die pads selectively coupled to the test TSVs (e.g., the die pads 216-1 and 216-2 coupled to the TSVs 804-1 and 804-2). At step 706, the prober 806 performs a measurement process. The prober 806 can test continuity of loopback path(s) formed by the test TSVs in order to characterize the TSV fabrication process. In the present example, the TSV 804-1 and the TSV 804-2 are coupled by a metal trace 808 on the backside of the substrate 102 to form a loopback path tested by the prober 806. The results of the measurement can be used as an indication of whether the TSV fabrication process has yielded "good" or "bad" TSVs in the mother IC die 202. The test process described in FIGS. 7 and 8 can be performed for each IC device 104 on the substrate 102 either in parallel, sequentially, or a combination thereof (e.g., sequentially testing groups of devices, where the devices are tested in parallel in each group).

Figure 4G:
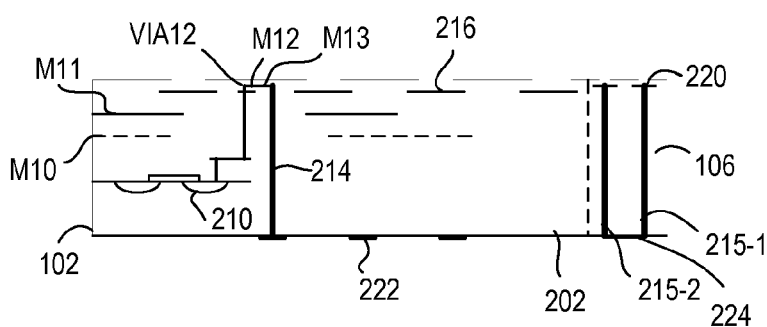
Figure 4H:
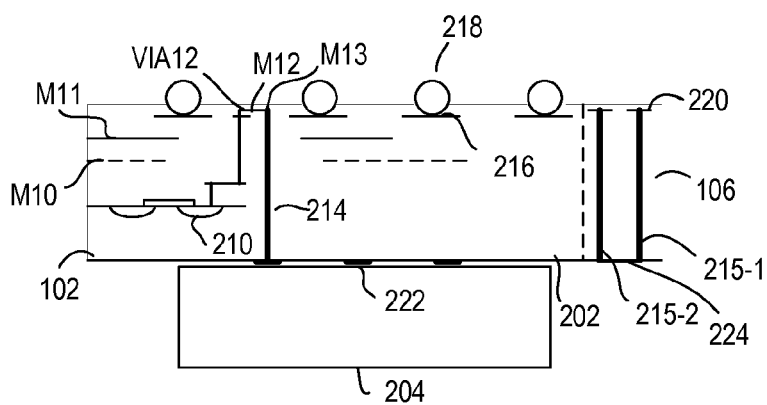

Returning to FIG. 3, at step 318, contacts are formed on the backside of the substrate for bonding with daughter IC die. For example, as shown in FIG. 4G, the contacts 222 are formed on the backside of the substrate 102 for the mother IC die 202. Some of the contacts 222 may be "dummy" contacts that are not electrically connected to TSVs, but rather provide structural support for an attached daughter die. Notably, the contacts can be selectively formed only on those IC devices 104 that have "good" mother IC die 202 per the testing done in step 316. At step 320, daughter IC die are attached to each of the IC devices 104 having "good" mother IC die 202. For example, as shown in FIG. 4H, the daughter IC die 204 is attached to the contacts 222 of the mother IC die 202. At step 322, each of the IC devices 104 having "good" mother IC die 202 are bumped. For example, as shown in FIG. 4H, the solder balls 218 are coupled to the die pads 216. The substrate 102 can then be sawn and the IC devices 104 separated. Daughter IC die are not attached to those IC devices 104 having a "bad" mother IC die 202, which reduces costs.

Figure 9:
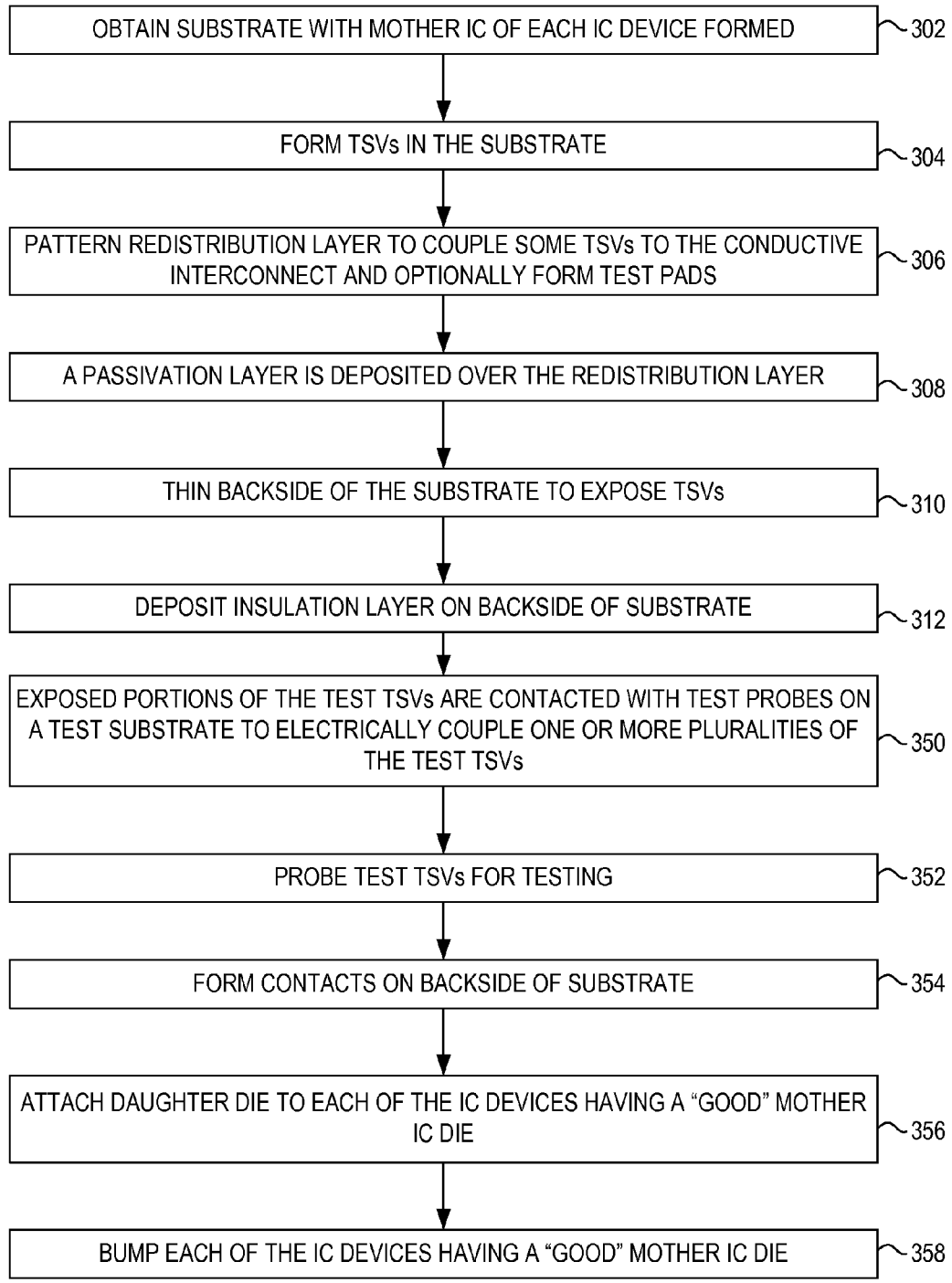
FIG. 9 is a flow diagram depicting a method of making a semiconductor device according to some embodiments of the invention.
Figure 10A:
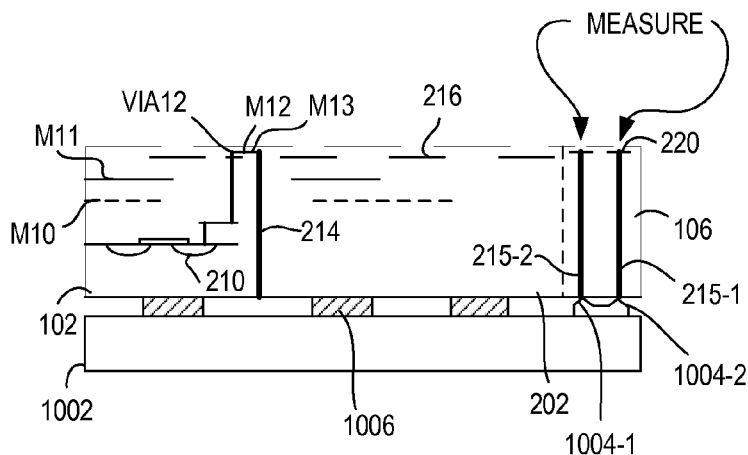
FIGS. 10A-C are cross-sections of a portion of a semiconductor device corresponding to steps in the method of FIG. 9.
Figure 10B:
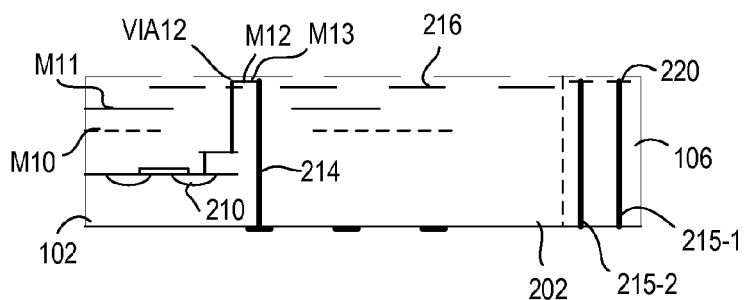
Figure 10C:
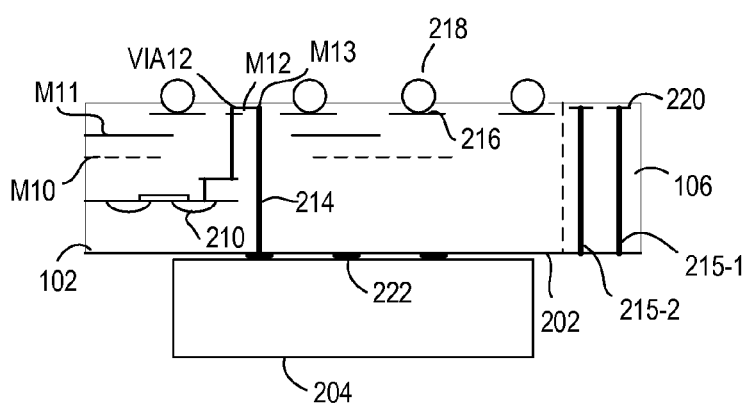

FIG. 9 is a flow diagram depicting a method 380 of making a semiconductor device according to some embodiments of the invention. Steps in the method 380 that are the same or similar to those of the method 300 shown in FIG. 3 are designated with identical reference numerals and described in detail above. FIGS. 10A-C are cross-sections of a portion of the semiconductor device corresponding to steps in the method 380. Elements in FIGS. 10A-C that are the same or similar to those shown in FIGS. 1 and 2 are designated with identical reference numerals.

The method 380 begins at step 302 and continues through step 312. Accordingly, device fabrication proceeds as shown in FIGS. 4A through 4E. After step 312, the method 380 proceeds to step 350. At step 350, the exposed portions of the test TSVs are contacted with test probes on a test substrate to electrically couple one or more pluralities of the test TSVs. The substrate 102 can be placed on a test substrate, rather than forming metal on the backside of the substrate to couple test TSVs. The test substrate 1002 can be a silicon substrate with the metal test probes formed thereon. The test substrate 1002 can be reusable for testing multiple semiconductor devices. The test probes 1004 can be formed on the test substrate 1002 using conventional lithography techniques and/or micro-electromechanical systems (MEMS) techniques.

For example, FIG. 10A shows the substrate 102 placed on a test substrate 1002. The test substrate 1002 includes test probes 1004-1 and 1004-2 that are electrically coupled together (collectively test probes 1004). The substrate 102 is placed on the test substrate 1002 such that the TSVs 215-1 and 215-2 are substantially aligned with the test probes 1004-1 and 1004-2. The test substrate 1002 may also include dummy pads 1006 to provide mechanical support for the substrate 102. When the substrate 102 is placed on the test substrate 1002, the TSV 215-1 is electrically coupled to the TSV 215-2 by the test probes 1004. The TSVs 215-1 and 215-2 form a loopback path through the test probes 1004. By way of example, two test TSVs are shown coupled to form the loopback path. It is to be understood that more than two test TSVs may be provided. Further, more than two test TSVs may be coupled together by test probes on the test substrate 1002.

The method 380 proceeds from step 350 to step 352, where the test TSVs can be probed for testing. Notably, testing may be performed using either the process 500 of FIG. 5 or the process 700 of FIG. 7. However, rather than using the metal trace 224 to form the loopback path (as shown in FIGS. 6 and 8), the test substrate 1002 shown in FIG. 10A is used.

After testing, the method 380 proceeds to step 354, where the test substrate is removed and contacts are formed on the backside of the substrate for bonding with daughter IC die. For example, as shown in FIG. 10B, the contacts 222 are formed on the backside of the substrate 102 for the mother IC die 202. Some of the contacts 222 may be "dummy" contacts that are not electrically connected to TSVs, but rather provide structural support for an attached daughter die. Notably, the contacts can be selectively formed only on those IC devices 104 that have "good" mother IC die 202 per the testing done in step 316. At step 356, daughter IC die are attached to each of the IC devices 104 having "good" mother IC die 202. For example, as shown in FIG. 100, the daughter IC die 204 is attached to the contacts 222 of the mother IC die 202. At step 358, each of the IC devices 104 having "good" mother IC die 202 are bumped. For example, as shown in FIG. 10C, the solder balls 218 are coupled to the die pads 216. The substrate 102 can then be sawn and the IC devices 104 separated. Daughter IC die are not attached to those IC devices 104 having a "bad" mother IC die 202, which reduces costs.

Figure 11:
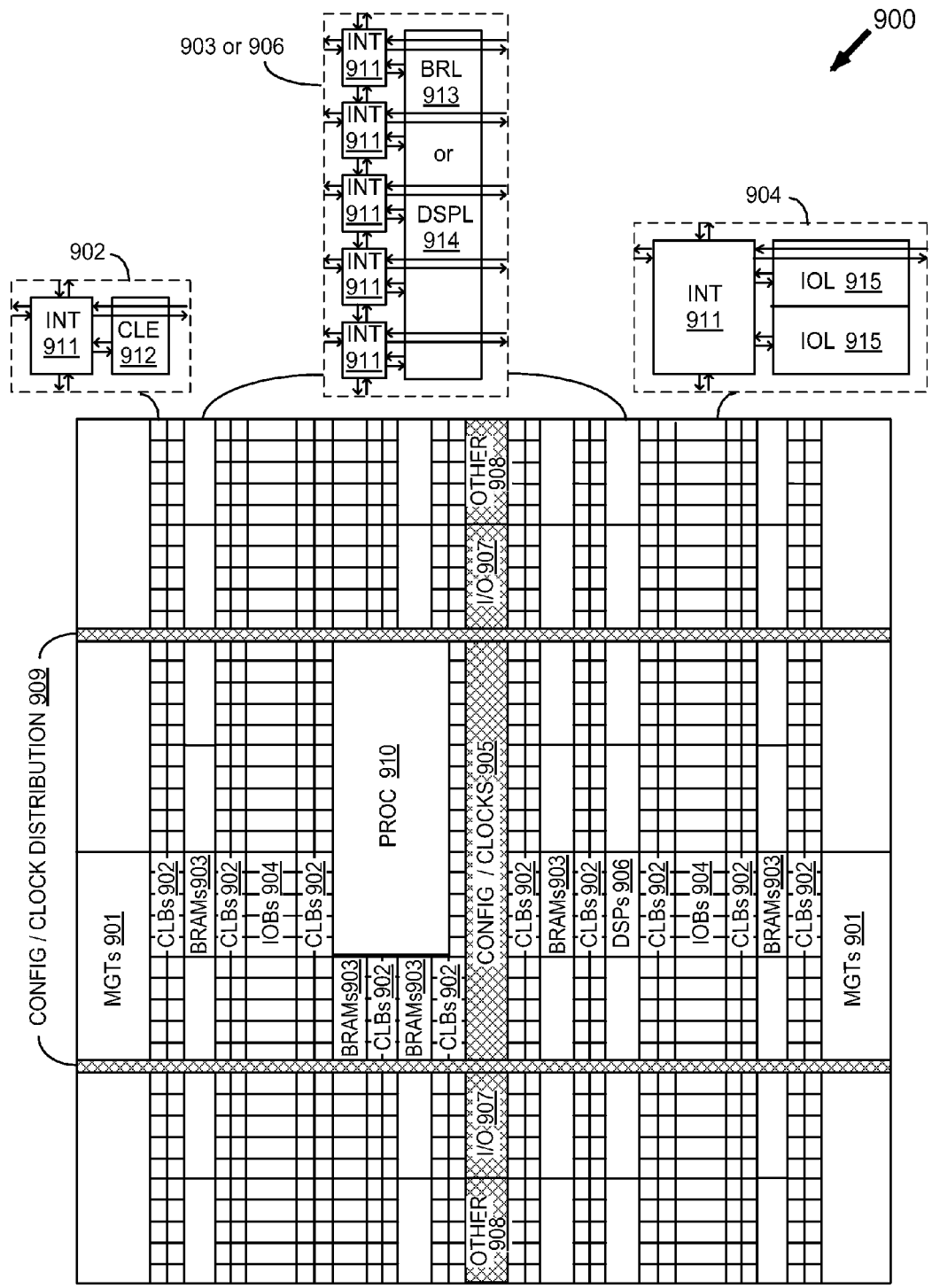
FIG. 11 illustrates an FPGA architecture.

FIG. 11 illustrates an FPGA architecture 900 that includes a large number of different programmable tiles including multi-gigabit transceivers (MGTs 901), configurable logic blocks (CLBs 902), random access memory blocks (BRAMs 903), input/output blocks (IOBs 904), configuration and clocking logic (CONFIG/CLOCKS 905), digital signal processing blocks (DSPs 906), specialized input/output blocks (I/O 907) (e.g., configuration ports and clock ports), and other programmable logic 908 such as digital clock managers, analog-to-digital converters, system monitoring logic, and so forth. A given set of programmable tiles of an FPGA is referred to herein as a programmable fabric of the FPGA.

In some FPGAs, each programmable tile includes a programmable interconnect element (INT 911) having standardized connections to and from a corresponding interconnect element in each adjacent tile. Therefore, the programmable interconnect elements taken together implement the programmable interconnect structure for the illustrated FPGA. The programmable interconnect element (INT 911) also includes the connections to and from the programmable logic element within the same tile, as shown by the examples included at the top of FIG. 11.

For example, a CLB 902 can include a configurable logic element (CLE 912) that can be programmed to implement user logic plus a single programmable interconnect element (INT 911). A BRAM 903 can include a BRAM logic element (BRL 913) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 906 can include a DSP logic element (DSPL 914) in addition to an appropriate number of programmable interconnect elements. An 10B 904 can include, for example, two instances of an input/output logic element (IOL 915) in addition to one instance of the programmable interconnect element (INT 911). As will be clear to those of skill in the art, the actual I/O pads connected, for example, to the I/O logic element 915 are manufactured using metal layered above the various illustrated logic blocks, and typically are not confined to the area of the input/output logic element 915.

The FPGA architecture 900 also includes one or more dedicated processor blocks (PROC 910). The processor block 910 comprises a microprocessor core, as well as associated control logic. Notably, such a microprocessor core may include embedded hardware or embedded firmware or a combination thereof for a "hard" or "soft" microprocessor. A soft microprocessor may be implemented using the programmable logic (e.g., CLBs, IOBs). For example, a MICROBLAZE soft microprocessor, available from Xilinx of San Jose, Calif., may be employed. A hard microprocessor may be implemented using an IBM POWER PC, Intel PENTIUM, AMD ATHLON, or like type processor core known in the art. The processor block 910 is coupled to the programmable logic of the FPGA in a well known manner.

In the pictured embodiment, a columnar area near the center of the die is used for configuration, clock, and other control logic. Horizontal areas 909 extending from this column are used to distribute the clocks and configuration signals across the breadth of the FPGA. In other embodiments, the configuration logic may be located in different areas of the FPGA die, such as in the corners of the FPGA die. Configuration information for the programmable logic is stored in configuration memory. The configuration logic 905 provides an interface to, and loads configuration data to, the configuration memory. A stream of configuration data ("configuration bitstream") may be coupled to the configuration logic 905, which in turn loads the configuration memory.

Some FPGAs utilizing the architecture illustrated in FIG. 11 include additional logic blocks that disrupt the regular columnar structure making up a large part of the FPGA. The additional logic blocks can be programmable blocks and/or dedicated logic. For example, the processor block PROC 910 shown in FIG. 11 spans several columns of CLBs and BRAMs.

Note that FIG. 11 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations as well as the location of the blocks within the array included at the top of FIG. 11 are purely exemplary. For example, in an actual FPGA more than one adjacent column of CLBs is typically included wherever the CLBs appear, to facilitate the efficient implementation of user logic.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. A method of making a semiconductor device, comprising:
    forming a plurality of through substrate vias (TSVs) in a substrate having an integrated circuit (IC) die, the substrate including an active side and a backside, the active side having a conductive interconnect formed thereon, the plurality of TSVs including exposed portions on the backside of the substrate;
    patterning first metal on the active side of the substrate to electrically couple the plurality of TSVs to a portion of the conductive interconnect; and
    coupling the exposed portions of the plurality of TSVs on the backside of the substrate to electrically couple together the plurality of TSVs.

2. The method of making a semiconductor device according to claim 1, wherein the plurality of TSVs are formed in the IC die.

3. The method of making a semiconductor device according to claim 2, wherein the IC die includes programmable circuitry, and wherein the portion of the conductive interconnect electrically couples the plurality of TSVs to the programmable circuitry.

4. The method of making a semiconductor device according to claim 3, further comprising:
    configuring the programmable circuitry to electrically couple the plurality of TSVs to die pads on the active side of the substrate; and
    probing the die pads to test the plurality of TSVs.

5. The method of making a semiconductor device according to claim 1, wherein the IC die is one of a plurality of IC dies on the substrate, and wherein the plurality of TSVs are formed in a scribe area between the IC die and another IC die of the plurality of IC dies.

6. The method of making a semiconductor device according to claim 1, wherein the patterning the first metal comprises:
    forming test pads exposed on the active side of the substrate and electrically coupled to the plurality of TSVs.

7. The method of making a semiconductor device according to claim 6, further comprising:
    probing the test pads to test the plurality of TSVs.

8. The method of making a semiconductor device according to claim 1, wherein the coupling comprises:
    patterning second metal on the backside of the substrate to electrically couple together the plurality of TSVs.

9. The method of making a semiconductor device according to claim 1, wherein the coupling comprises:
    contacting the exposed portions of the plurality of TSVs with test probes on a test substrate to electrically couple together the plurality of TSVs.

10. A semiconductor device, comprising:
    a plurality of through substrate vias (TSVs) in a substrate having an integrated circuit (IC) die, the substrate including an active side and a backside, the active side having a conductive interconnect formed thereon, the plurality of TSVs having exposed portions on the backside of the substrate; and
    a first metal on the active side of the substrate to electrically couple the plurality of TSVs to a portion of the conductive interconnect;
    wherein the exposed portions of the plurality of TSVs on the backside of the substrate are coupled together in order to electrically couple together the plurality of TSVs.

11. The semiconductor device of claim 10, wherein the plurality of TSVs are formed in a scribe area associated with the IC die.

12. The semiconductor device of claim 10, wherein the first metal comprises test pads exposed on the active side of the substrate and electrically coupled to at least one TSV of the plurality of TSVs.

13. The semiconductor device of claim 10, wherein the plurality of TSVs are electrically coupled by second metal on the backside of the substrate.

14. The semiconductor device of claim 10, wherein the exposed portions of the plurality of TSVs are electrically coupled with test probes before the semiconductor device is formed.

15. The semiconductor device of claim 10, wherein at least one TSV of the plurality of TSVs is separated from the IC die when the semiconductor device is formed.

* * * * *